(12) United States Patent
Grassl

(10) Patent No.: US 7,144,757 B1
(45) Date of Patent: Dec. 5, 2006

(54) CIRCUIT SUITABLE FOR VERTICAL INTEGRATION AND METHOD OF PRODUCING SAME

(75) Inventor: Thomas Grassl, Freising (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 09/926,377

(22) PCT Filed: Apr. 19, 2000

(86) PCT No.: PCT/EP00/03575

§ 371 (c)(1),
(2), (4) Date: Dec. 13, 2001

(87) PCT Pub. No.: WO00/65648

PCT Pub. Date: Nov. 2, 2000

(30) Foreign Application Priority Data

Apr. 23, 1999 (DE) ................................ 199 18 671

(51) Int. Cl.
*H01L 21/44* (2006.01)

(52) U.S. Cl. ..................... 438/108; 438/107; 257/705; 257/13

(58) Field of Classification Search ................ 438/107, 438/109, 618, 620, 622, 637, 669, 108, 15, 438/455; 257/686, 700, 705, 13, 567, 237
See application file for complete search history.

(56) References Cited

U.S. PATENT DOCUMENTS

| | | | |
|---|---|---|---|
| 3,648,131 A | 3/1972 | Stuby | |
| 4,893,174 A | 1/1990 | Yamada et al. | |
| 4,939,568 A | 7/1990 | Kato et al. | |
| 5,122,856 A | 6/1992 | Komiya | |
| 5,229,647 A | 7/1993 | Gnadinger | |
| 5,426,072 A * | 6/1995 | Finnila ........................ 438/107 |
| 5,563,084 A * | 10/1996 | Ramm et al. .................. 438/15 |
| 5,591,678 A | 1/1997 | Bendik et al. | |
| 5,627,106 A | 5/1997 | Hsu | |
| 5,646,052 A | 7/1997 | Lee | |
| 6,104,081 A * | 8/2000 | Dekker et al. ............... 257/618 |
| 6,444,493 B1 * | 9/2002 | Feil et al. .................... 438/108 |
| 6,495,454 B1 * | 12/2002 | Livengood et al. ......... 438/667 |

FOREIGN PATENT DOCUMENTS

DE 19918671 A1 * 11/2000

OTHER PUBLICATIONS

Wolf et al., Silicon Processing for the VLSI Era (2000), Lattice Press, vol. 1, Second Edition, pp. 268-269.*
Quirk et al., Semiconductor Manufacturing Technology (2001), Prentice Hall, p. 301.*

* cited by examiner

*Primary Examiner*—Laura M. Schillinger
(74) *Attorney, Agent, or Firm*—Bacon & Thomas, PLLC

(57) ABSTRACT

This invention relates to a vertically integratable circuit and a method for producing same.

Unlike known methods for producing vertical electric connections, the present method uses process steps in the production of the vertically integratable circuit itself to permit vertical integration. This simplifies the sequence of production for vertically integratable circuits and thus the three-dimensional integrated circuit as a whole, thereby optimizing plant running times since process steps are saved. Because finished substrates are no longer the starting point for producing the vertical electric connections, an improved yield is moreover obtained since no process steps which could in particular change the already produced active circuit elements, such as steps with high process temperatures, are necessary any longer after production of the circuit elements.

8 Claims, 2 Drawing Sheets

CIRCUIT SUITABLE FOR VERTICAL INTEGRATION AND METHOD OF PRODUCING SAME

BACKGROUND OF THE INVENTION

This invention relates to a vertically integratable circuit and a method for producing same.

Vertically integratable circuits refer to semiconductor circuits produced by planar technology which are disposed vertically one above the other in several levels, resulting in three-dimensional circuits. The single components and circuit elements of the different levels are electrically interconnected by vertical contacts. This permits higher packing density to be attained compared to two-dimensional circuits, i.e. circuits in only one level. Vertical integration also offers advantages in terms of security since especially sensitive circuit elements can be disposed in levels or layers surrounded on both sides by at least one further level or layer with active components.

In the production of the three-dimensional circuits, in particular the vertical contacts deviate from known technologies since the single vertically integratable circuits are produced by known and readily controllable planar technology. Several methods have become known for producing the vertical contacts.

One known method is based on depositing polycrystalline silicon on a finished component layer and recrystallizing it. Further components can be fabricated in the recrystallized layer. The disadvantage of this method is that the high temperatures during recrystallization can change the properties of the finished active components of the lower level. Furthermore, the serial processing of the vertically integrated overall circuit results in an accordingly longer turn-around time for production.

In another known method it is provided that the single vertically integratable circuits or levels of circuits are produced separately on different substrates. Substrates with single circuit levels are then thinned, provided with front side and backside contacts and connected vertically by a bonding method. The disadvantage of this method is that the front side and backside contacts are produced partly using materials not readily usable in known semiconductor manufacturing processes.

DE 44 33 845 A1 discloses a method for producing a three-dimensional integrated circuit wherein two finished substrates or single circuits are interconnected. For vertical electric connection of the circuits contained on both substrates, further process steps are performed to produce a metalization after connecting the two substrates one of which was thinned. The disadvantage of the known method is that completely processed substrates must be made available and additional process steps are required for producing the vertical electric connection.

The problem of the present invention is thus to state a vertically integratable circuit and a method for producing same that manages with fewer process steps.

SUMMARY OF THE INVENTION

It is assumed that the vertical electric contacts are produced using process steps in the production of the vertically integratable circuit itself. This simplifies the sequence of production for vertically integratable circuits and thus the three-dimensional integrated circuit as a whole, thereby optimizing plant running times since process steps are saved. Because finished substrates are no longer the starting point for producing the vertical electric connections, an improved yield is moreover obtained since no process steps which could in particular change the already produced active circuit elements, such as steps with high process temperatures, are necessary any longer after production of the circuit elements.

BRIEF DESCRIPTION OF THE DRAWINGS

Further advantages of the invention will result from the following exemplary description with reference to figures, in which:

FIG. 1 shows the sequence of process steps in the production of vertically integratable circuits.

DETAILED DESCRIPTION OF THE INVENTION

Figure 1A:
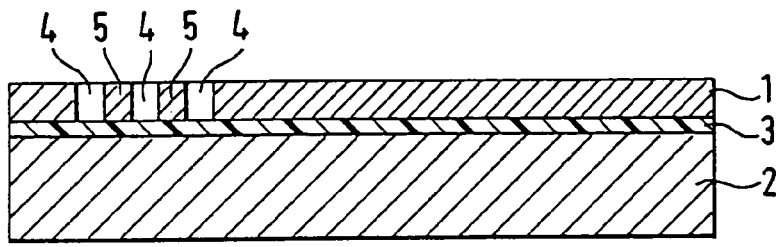
FIG. 1 shows different process steps of a method for producing vertically integratable circuits.

FIG. 1a shows substrate 1, 2 in which insulating layer 3 is hidden. Substrate 1, 2 can consist e.g. of silicon, insulating layer 3 e.g. of silicon dioxide. Such substrates are known and referred to as SOI (silicon on insulator) substrates. Gaps 4 are formed, e.g. by etching, in substrate 1 above insulating layer 3 as far as insulating layer 3 and surrounding bars 5 in substrate 1. Bars 5 are so dimensioned that they can be completely oxidized in a following process step. Gaps 4 and bars 5 are so dimensioned that their surface area suffices for receiving contacts for vertical integration and for forming an insulation for said contacts. Simultaneously with gaps 4, alignment marks (not shown) can also be etched to be later used for aligning the circuits or the substrate for vertical integration.

Figure 1B:
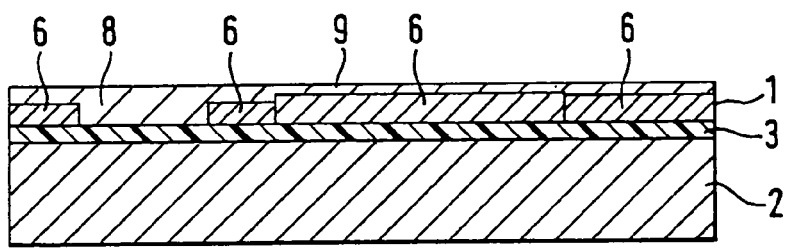

FIG. 1b shows SOI substrate 1, 2, 3 after further process steps. Differently doped tubs 6 and oxide layers 8 and 9 have been produced. Doped tubs 6 as well as field oxide 8 and gate oxide 9 later form the active components of the vertically integratable circuit. Their production and mode of functioning is known and therefore need not be described, especially since it is not of importance for understanding the present invention. After oxidation, e.g. high-temperature oxidation, there is at the place of gaps 4 and bars 5 of FIG. 1a an oxide that is part of field oxide 8 and reaches as far as insulating layer 3. During oxidation one must make sure the field oxide is free from cavities and the resulting surface is as planar as possible.

Figure 1C:
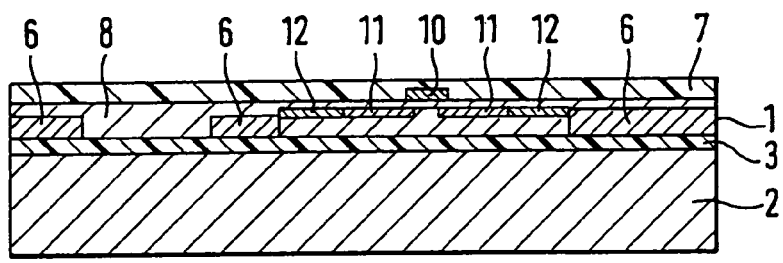

FIG. 1c shows substrate 1, 2, 3, after completion of the components, e.g. by incorporation of different doping materials 11 and 12 or by application of polycrystalline silicon 10. To permit further processing, insulating or planarizing layer 7, e.g. of photoresist or polyimide, has furthermore been applied.

Figure 1D:
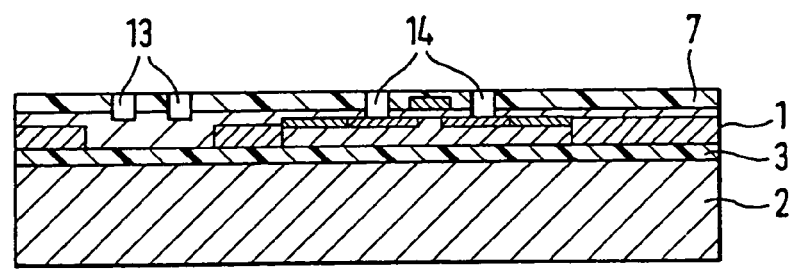

FIG. 1d shows gaps 13 and 14 formed for a first metalization level, which can be produced for example by etching and are known as vias. Gaps 14 are used for connecting a component, a transistor here; gaps 13 are intended for later vertical integration.

Figure 1E:
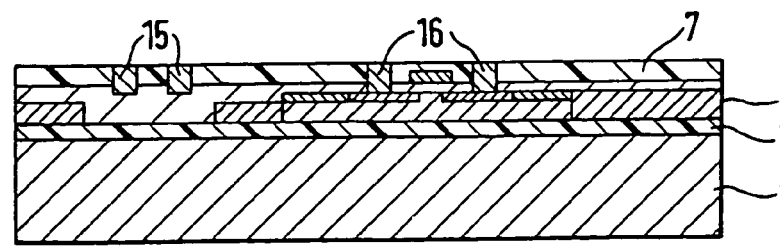

FIG. 1e shows through metalizations 15 and 16 formed for the first metalization level which fill vias 13 and 14 of FIG. 1d. In a subsequent process step (not shown) a metalization is applied to the surface of planarizing layer 7 for connecting through metalizations 15 and 16. Aluminum is normally used for the metalizations.

Further metalization levels can follow, whereby an insulating layer, e.g. of silicon dioxide, is applied after each metalization level. Besides the shown and described production of gaps 13 and through metalizations 15 for the contacts for vertical integration in the first metalization level, they can also be provided in other metalization levels. After production of all metalization levels, different cover layers are usually applied, such as a passivation layer, oxide layer and planarizing layer.

Figure 1F:
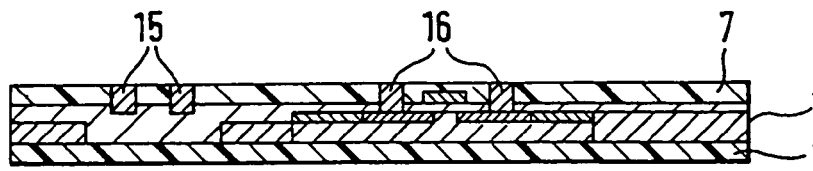

FIG. 1f shows substrate 1, 3 after thinning. Lower layer 2 of substrate 1, 2, 3, as shown in the preceding figures, was removed e.g. by an etching operation. The shown use of a substrate with hidden insulating layer 3 proves especially advantageous since the latter serves as an etching stop. But it is also fundamentally possible to use other substrates. However, the latter must be insulated on the backside e.g. by oxide deposition after thinning. For handling the substrate during thinning and subsequent processing, the substrate can be applied with its processed surface 1 to a handling wafer from which it is detached after complete processing. The substrate is thinned as far as oxide 8 in this case. In both cases it can also be provided that through metalization 15 is formed up to the end of oxide 8, i.e. the previous etching is accordingly deep.

Figure 1G:
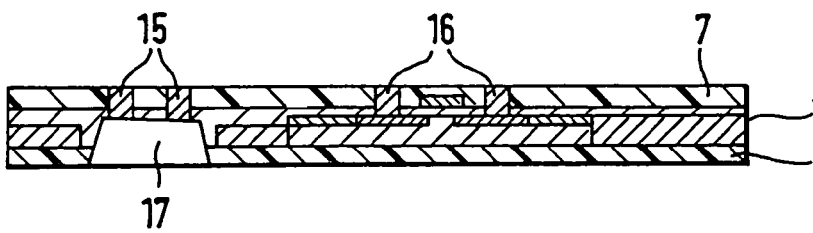

FIG. 1g shows processed substrate 1, 3 wherein gaps 17 have been etched from backside 3 at the places of the contacts for vertical integration. The etching, which can be done wet-chemically for example, reaches as far as through metalizations 15.

Figure 1H:
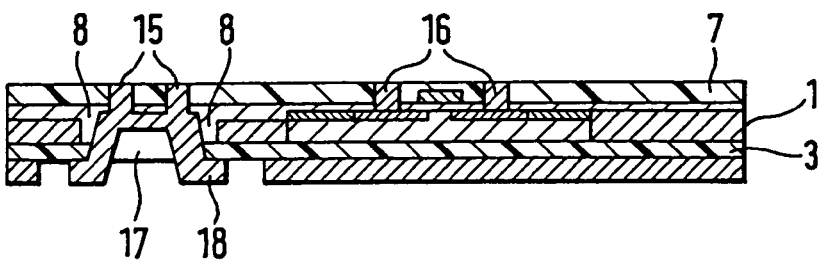

FIG. 1h shows final backside metalization 18 of substrate 1, 3. Backside metalization 18 is performed so as to create contacts 15, 18 required for vertical integration, i.e. backside metalization 18 is interrupted at the places of through metalization IS, as shown in FIG. 1h. Finally, cover layers can also be applied to the backside metalization, as described above for the front side of the substrate. As described above, oxide 8 was dimensioned at the place of contact for vertical integration 15, 18 so as to completely enclose contact for vertical integration 15, 18 for electric insulation.

The circuits or substrates for vertical integration produced by the above described method are then joined together for example with backside metalizations 18, the abovementioned alignment marks being used for alignment. Connection of more than two substrates is possible if the contacts for vertical integration are also guided onto the surface of processed substrate 1. In this case it might be necessary to use infrared technologies for alignment since the alignment marks may be covered by the vertical integration.

For producing an electric connection between the contacts for vertical integration in different levels, i.e. different substrates, backside metalizations or metalizations on the surfaces of the processed substrates can be provided which melt or begin to melt at low temperatures to yield a reliable electric connection. Places on the surfaces, on the front side or backside of the substrate, with contacts for vertical integration must furthermore not be covered by the abovementioned cover layers so that an electric connection can be made. For this purpose such places can either be left out during production of the cover layers, or for example be etched free after production of the cover layers.

For vertical integration it can be provided that whole substrates provided with contacts for vertical integration are connected in the described way. It is also possible to divide the substrates into single circuits and vertically integrate single circuits. Before vertical integration the single circuits can be tested and faulty ones rejected. Another possibility is vertical integration of single circuits on circuits of a whole substrate and subsequent division of the substrate. This possibility also permits prior functional testing of both the single circuits and the circuits on the substrate.

Besides the above-described process for producing vertically integratable circuits on the basis of a silicon substrate, it is also possible to use the inventive method for processes based on other semiconductor materials.

Figure 2:
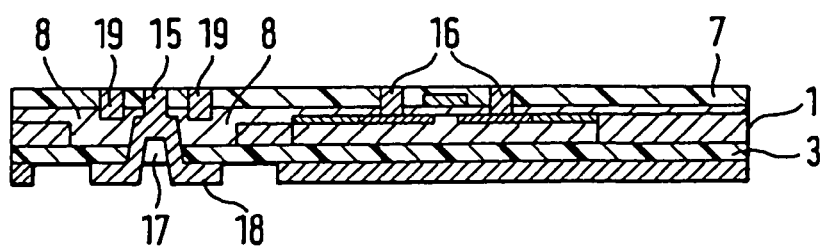
FIG. 2 shows an embodiment of an electrically conductive connection for vertical integration of circuits.

FIG. 2 shows an advantageous embodiment of an inventive contact for vertical integration. In addition to contact for vertical integration 15, 18 described in connection with FIG. 1, further metalization 19 is provided within insulating oxide 8. Metalization 19 is e.g. of annular design and completely surrounds the moralization of contact for vertical integration 15. Further, annular metalization 19 is electrically connected by the metalization applied to the surface in a later process step so that it is grounded in operation. This permits the signal flow through vertical contact 15, 18 to be shielded. Then the signal flow through the contact for vertical integration cannot be evaluated from one of the end faces of the substrate in case the contact for vertical integration is located near one of the end faces of the substrate.

The invention claimed is:

1. A method for making a vertically integratable circuit comprising the steps of:
    providing first and second substrates, and a first insulation layer interposed between the first and second substrates, the first substrate located on a first side of the first insulation layer and the second substrate located on a second side of the first insulation layer opposed to the first side;
    providing the first substrate with active circuit components along and within at least one portion thereof to define a first circuit layer;
    applying a second insulation layer over the first circuit layer;
    forming at least one first gap through the second insulation layer that extends at least a portion into the first circuit layer and is in communication with the active circuit components thereof;
    filling the at least one first gap with a first metalization that defines at least one first side vertical contact;
    thinning the second substrate to expose the second side of the first insulation layer;
    forming at least one second gap through the first insulation layer that extends at least into a portion of the first circuit layer, the at least one second gap generally coinciding with the at least one first side vertical contact; and
    applying a second metalization along the second side of the first insulation layer, at least a portion of the second metalization extending through the at least one second gap to contact the first side vertical contact and defining a second side vertical contact.

2. The method according to claim 1, wherein portions of the second metalization are interrupted at locations corresponding to the at least one first side vertical contact.

3. The method according to claim 1, wherein some of the active circuit components of the first circuit layer extend to the first insulation layer and surround the connection between the first and second side vertical contacts.

4. The method according to claim 3, further comprising the steps of:
    forming an annular gap in the second insulation layer, the annular gap extending into at least a portion of the first circuit layer and surrounding the first side vertical contact such that some of the active circuit components intermediate the annular gap and the first side vertical contact; and filling the annular gap with a third metalization.

5. A vertically integratable circuit, comprising:

a first insulation layer having a generally planar form, and opposed first and second sides, the first insulation layer defining at least one opening extending therethrough;

a first circuit layer bearing a plurality of active circuit components, a first side of the first circuit layer located on the first side of the first insulation layer;

a second insulation layer positioned on a second side of the first circuit layer opposed to the first side thereof, said second insulation layer having at least one first side vertical contact extending therethrough and into at least a portion of the first circuit layer; and a second circuit layer located along the second side of the first insulation layer and defined as a metallized layer, the second circuit layer having a second side portion extending through the at least one opening of the first insulation layer and into at least a portion of the first circuit layer so as to connect to the first side vertical contact.

6. The circuit according to claim 5, further comprising:

an annular metalization extending through the second insulation layer and into at least a portion of the first circuit layer, a third metalization annularly surrounding the first side vertical contact with at least a portion of the active circuit components interposed therebetween.

7. A method for making a vertically integratable circuit consisting essentially the steps of:

providing first and second substrates, and a first insulation layer interposed between the first and second substrates, the first substrate located on a first side of the first insulation layer and the second substrate located on the second side of the first insulation layer;

providing the first substrate with active circuit components along and within at least one portion thereof to define a first circuit layer;

applying a second insulation layer over the first circuit layer;

forming at least one first gap through the second insulation layer and extending at least a portion into the first circuit layer in communication with the or active circuit components thereof;

filling the at least one first gap with a first metalization, that devines at least one first side vertical contact;

thinning the second substrate to expose the second side of the first insulation layer;

forming at least one second gap through the first insulation layer that extends at least into a portion of the first circuit layer adjacent the first insulation layer, the at least one second gap generally coinciding with the at least one first side vertical contact;

applying a second metalization along the second side of the first insulation layer, at least a portion of the second metalization extending through the at least one second gap to contact the first side vertical contact and defining at least one second side vertical contact;

forming an annular gap in the second insulation layer, the annular gap extending into at least a portion of the first circuit layer and surrounding the at least one first side vertical contact such that a portion of the active circuit components is intermediate the annular gap and the at least one first side vertical contact; and filling the annular gap with a third metalization.

8. A vertically integratable circuit, consisting essentially of:

a first insulation layer having a generally planar form, and opposed first and second sides, the first insulation layer defining at least one opening extending therethrough;

a first circuit layer bearing a plurality of active circuit components, a first side of the first circuit layer located on the first side of the first insulation layer;

a second insulation layer positioned on a second side of the first circuit layer, said second insulation layer having at least one first side vertical contact extending therethrough and into at least a portion of the first circuit layer;

a second circuit layer located along the second side of the first insulation layer and defined as a metallized layer, the second circuit layer having a second side portion extending through the at least one opening of the first insulation layer and into at least a portion of the first circuit layer so as to connect to the first side vertical contact;

an annular metalization extending through the second insulation layer and into at least a portion of the first circuit layer, a third metalization annularly surrounding the first side vertical contact with at least a portion of the active circuit components interposed therebetween.

* * * * *